United States Patent
Restaino et al.

(10) Patent No.: US 7,598,699 B2
(45) Date of Patent: Oct. 6, 2009

(54) REPLACEABLE CLAMP FOR ELECTRONIC BATTERY TESTER

(75) Inventors: Harvey A. Restaino, Palos Park, IL (US); Timothy Paul Demel, Algonquin, IL (US); Christian Pimentel, Willowbrook, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/783,682

(22) Filed: Feb. 20, 2004

(65) Prior Publication Data
US 2005/0184732 A1    Aug. 25, 2005

(51) Int. Cl.
*H02J 7/00* (2006.01)
(52) U.S. Cl. ........... 320/105; 439/504
(58) Field of Classification Search .......... 320/105; 439/504, 705, 759, 829, 822; 24/499, 505; 30/363
See application file for complete search history.

(56) References Cited

U.S. PATENT DOCUMENTS

| | | | | |
|---|---|---|---|---|
| 2,000,665 A | 5/1935 | Neal | ............ | 173/324 |
| 2,514,745 A | 7/1950 | Dalzell | ............ | 171/95 |
| 3,267,452 A * | 8/1966 | Wolf | ............ | 324/437 |
| 3,356,936 A | 12/1967 | Smith | ............ | 324/29.5 |
| 3,562,634 A | 2/1971 | Latner | ............ | 31/4 |
| 3,593,099 A | 7/1971 | Scholl | ............ | 320/13 |
| 3,607,673 A | 9/1971 | Seyl | ............ | 204/1 |
| 3,652,341 A | 3/1972 | Halsall et al. | ............ | 136/176 |
| 3,676,770 A | 7/1972 | Sharaf et al. | ............ | 324/29.5 |
| 3,729,989 A | 5/1973 | Little | ............ | 73/133 |
| 3,750,011 A | 7/1973 | Kreps | ............ | 324/29.5 |
| 3,753,094 A | 8/1973 | Furuishi et al. | ............ | 324/29.5 |
| 3,796,124 A | 3/1974 | Crosa | ............ | 85/36 |
| 3,808,522 A | 4/1974 | Sharaf | ............ | 324/29.5 |
| 3,811,089 A | 5/1974 | Strzelewicz | ............ | 324/170 |
| 3,850,490 A * | 11/1974 | Zehr | ............ | 439/822 |
| 3,873,911 A * | 3/1975 | Champlin | ............ | 324/430 |
| 3,876,931 A | 4/1975 | Godshalk | ............ | 324/29.5 |
| 3,886,443 A | 5/1975 | Miyakawa et al. | ............ | 324/29.5 |
| 3,889,248 A | 6/1975 | Ritter | ............ | 340/249 |
| 3,906,329 A | 9/1975 | Bader | ............ | 320/44 |

(Continued)

FOREIGN PATENT DOCUMENTS

DE      29 26 716 B1      1/1981

(Continued)

OTHER PUBLICATIONS

Notification of Transmittal of the International Search Report along with the Search Report for International Application No. PCT/US03/27696, filed Sep. 4, 2003, date of mailing Apr. 15, 2004.

(Continued)

*Primary Examiner*—Edward Tso
*Assistant Examiner*—Samuel Berhanu
(74) *Attorney, Agent, or Firm*—Leanne Taveggia Farrell; Westman, Champlin & Kelly, P.A.

(57) ABSTRACT

A method and apparatus for coupling a battery charger and/or a battery tester to a battery is provided. A clamp can be selectively removed from a cable. This allows replacement of the clamp as desired as well as fixedly or removably coupling the cable to the battery tester or charger.

11 Claims, 6 Drawing Sheets

U.S. PATENT DOCUMENTS

| | | | | |
|---|---|---|---|---|
| 3,909,708 A | 9/1975 | Champlin | | 324/29.5 |
| 3,936,744 A | 2/1976 | Perlmutter | | 324/158 |
| 3,946,299 A | 3/1976 | Christianson et al. | | 320/43 |
| 3,947,757 A | 3/1976 | Grube et al. | | 324/28 |
| 3,969,667 A | 7/1976 | McWilliams | | 324/29.5 |
| 3,979,664 A | 9/1976 | Harris | | 324/17 |
| 3,984,762 A | 10/1976 | Dowgiallo, Jr. | | 324/29.5 |
| 3,984,768 A | 10/1976 | Staples | | 324/62 |
| 3,989,544 A | 11/1976 | Santo | | 429/65 |
| 4,008,619 A | 2/1977 | Alcaide et al. | | 73/398 |
| 4,023,882 A | 5/1977 | Pettersson | | 339/96 |
| 4,024,953 A | 5/1977 | Nailor, III | | 206/344 |
| 4,047,091 A | 9/1977 | Hutchines et al. | | 363/59 |
| 4,053,824 A | 10/1977 | Dupuis et al. | | 324/29.5 |
| 4,056,764 A | 11/1977 | Endo et al. | | 320/3 |
| 4,057,313 A * | 11/1977 | Polizzano | | 439/219 |
| 4,070,624 A | 1/1978 | Taylor | | 327/158 |
| 4,086,531 A | 4/1978 | Bernier | | 324/158 |
| 4,112,351 A | 9/1978 | Back et al. | | 324/16 |
| 4,114,083 A | 9/1978 | Benham et al. | | 320/39 |
| 4,126,874 A | 11/1978 | Suzuki et al. | | 354/60 |
| 4,160,916 A | 7/1979 | Papasideris | | 307/10 |
| 4,178,546 A | 12/1979 | Hulls et al. | | 324/158 |
| 4,193,025 A | 3/1980 | Frailing et al. | | 324/427 |
| 4,207,611 A | 6/1980 | Gordon | | 364/580 |
| 4,217,645 A | 8/1980 | Barry et al. | | 364/483 |
| 4,280,457 A | 7/1981 | Bloxham | | 123/198 |
| 4,297,639 A | 10/1981 | Branham | | 324/429 |
| 4,315,204 A | 2/1982 | Sievers et al. | | 322/28 |
| 4,316,185 A | 2/1982 | Watrous et al. | | 340/636 |
| 4,322,685 A | 3/1982 | Frailing et al. | | 324/429 |
| 4,351,405 A | 9/1982 | Fields et al. | | 180/65 |
| 4,352,067 A | 9/1982 | Ottone | | 324/434 |
| 4,360,780 A | 11/1982 | Skutch, Jr. | | 324/437 |
| 4,361,809 A | 11/1982 | Bil et al. | | 324/426 |
| 4,363,407 A | 12/1982 | Barkler et al. | | 209/3.3 |
| 4,369,407 A | 1/1983 | Korbell | | 324/416 |
| 4,379,989 A | 4/1983 | Kurz et al. | | 320/26 |
| 4,379,990 A | 4/1983 | Sievers et al. | | 322/99 |
| 4,385,269 A | 5/1983 | Aspinwall et al. | | 320/14 |
| 4,390,828 A | 6/1983 | Converse et al. | | 320/32 |
| 4,392,101 A | 7/1983 | Saar et al. | | 320/20 |
| 4,396,880 A | 8/1983 | Windebank | | 320/21 |
| 4,408,157 A | 10/1983 | Beaubien | | 324/62 |
| 4,412,169 A | 10/1983 | Dell'Orto | | 320/64 |
| 4,423,378 A | 12/1983 | Marino et al. | | 324/427 |
| 4,423,379 A | 12/1983 | Jacobs et al. | | 324/429 |
| 4,424,491 A | 1/1984 | Bobbett et al. | | 324/433 |
| 4,459,548 A | 7/1984 | Lentz et al. | | 324/158 |
| 4,514,694 A | 4/1985 | Finger | | 324/429 |
| 4,520,353 A | 5/1985 | McAuliffe | | 340/636 |
| 4,521,498 A * | 6/1985 | Juergens | | 429/59 |
| 4,564,798 A | 1/1986 | Young | | 320/6 |
| 4,620,767 A | 11/1986 | Woolf | | 339/255 |
| 4,633,418 A | 12/1986 | Bishop | | 364/554 |
| 4,659,977 A | 4/1987 | Kissel et al. | | 320/64 |
| 4,663,580 A | 5/1987 | Wortman | | 320/35 |
| 4,665,370 A | 5/1987 | Holland | | 324/429 |
| 4,667,143 A | 5/1987 | Cooper et al. | | 320/22 |
| 4,667,279 A | 5/1987 | Maier | | 363/46 |
| 4,678,998 A | 7/1987 | Muramatsu | | 324/427 |
| 4,679,000 A | 7/1987 | Clark | | 324/428 |
| 4,680,528 A | 7/1987 | Mikami et al. | | 320/32 |
| 4,686,442 A | 8/1987 | Radomski | | 320/17 |
| 4,697,134 A | 9/1987 | Burkum et al. | | 320/48 |
| 4,707,795 A | 11/1987 | Alber et al. | | 364/550 |
| 4,709,202 A | 11/1987 | Koenck et al. | | 320/43 |
| 4,710,861 A | 12/1987 | Kanner | | 363/46 |
| 4,719,428 A | 1/1988 | Liebermann | | 324/436 |
| 4,723,656 A | 2/1988 | Kiernan et al. | | 206/333 |
| 4,743,855 A | 5/1988 | Randin et al. | | 324/430 |
| 4,745,349 A | 5/1988 | Palanisamy et al. | | 320/22 |
| 4,781,629 A * | 11/1988 | Mize | | 439/822 |
| 4,816,768 A | 3/1989 | Champlin | | 324/428 |
| 4,820,966 A | 4/1989 | Fridman | | 320/32 |
| 4,825,170 A | 4/1989 | Champlin | | 324/436 |
| 4,847,547 A | 7/1989 | Eng, Jr. et al. | | 320/35 |
| 4,849,700 A | 7/1989 | Morioka et al. | | 324/427 |
| 4,874,679 A | 10/1989 | Miyagawa | | 429/91 |
| 4,876,495 A | 10/1989 | Palanisamy et al. | | 320/18 |
| 4,881,038 A | 11/1989 | Champlin | | 324/426 |
| 4,888,716 A | 12/1989 | Ueno | | 364/550 |
| 4,912,416 A | 3/1990 | Champlin | | 324/430 |
| 4,913,116 A | 4/1990 | Katogi et al. | | 123/425 |
| 4,926,330 A | 5/1990 | Abe et al. | | 364/424.03 |
| 4,929,931 A | 5/1990 | McCuen | | 340/636 |
| 4,931,738 A | 6/1990 | MacIntyre et al. | | 324/435 |
| 4,932,905 A * | 6/1990 | Richards | | 439/822 |
| 4,933,845 A | 6/1990 | Hayes | | 364/200 |
| 4,934,957 A | 6/1990 | Bellusci | | 439/504 |
| 4,937,528 A | 6/1990 | Palanisamy | | 324/430 |
| 4,947,124 A | 8/1990 | Hauser | | 324/430 |
| 4,949,046 A | 8/1990 | Seyfang | | 324/427 |
| 4,956,597 A | 9/1990 | Heavey et al. | | 320/14 |
| 4,968,941 A | 11/1990 | Rogers | | 324/428 |
| 4,968,942 A | 11/1990 | Palanisamy | | 324/430 |
| 4,969,834 A * | 11/1990 | Johnson | | 439/141 |
| 4,983,086 A * | 1/1991 | Hatrock | | 411/259 |
| 5,004,979 A | 4/1991 | Marino et al. | | 324/160 |
| 5,032,825 A | 7/1991 | Xuznicki | | 340/636 |
| 5,037,778 A | 8/1991 | Stark et al. | | 437/216 |
| 5,047,722 A | 9/1991 | Wurst et al. | | 324/430 |
| 5,081,565 A | 1/1992 | Nabha et al. | | 362/61 |
| 5,087,881 A | 2/1992 | Peacock | | 324/378 |
| 5,095,223 A | 3/1992 | Thomas | | 307/110 |
| 5,108,320 A | 4/1992 | Kimber | | 439/883 |
| 5,126,675 A | 6/1992 | Yang | | 324/435 |
| 5,140,269 A | 8/1992 | Champlin | | 324/433 |
| 5,144,218 A | 9/1992 | Bosscha | | 320/44 |
| 5,144,248 A | 9/1992 | Alexandres et al. | | 324/428 |
| 5,159,272 A | 10/1992 | Rao et al. | | 324/429 |
| 5,160,881 A | 11/1992 | Schramm et al. | | 322/7 |
| 5,170,124 A | 12/1992 | Blair et al. | | 324/434 |
| 5,179,335 A | 1/1993 | Nor | | 320/21 |
| 5,194,799 A | 3/1993 | Tomantschger | | 320/2 |
| 5,204,611 A | 4/1993 | Nor et al. | | 320/21 |
| 5,214,370 A | 5/1993 | Harm et al. | | 320/35 |
| 5,214,385 A | 5/1993 | Gabriel et al. | | 324/434 |
| 5,241,275 A | 8/1993 | Fang | | 324/430 |
| 5,254,952 A | 10/1993 | Salley et al. | | 324/429 |
| 5,266,880 A | 11/1993 | Newland | | 320/14 |
| 5,281,919 A | 1/1994 | Palanisamy | | 324/427 |
| 5,281,920 A | 1/1994 | Wurst | | 324/430 |
| 5,295,078 A | 3/1994 | Stich et al. | | 364/483 |
| 5,298,797 A | 3/1994 | Redl | | 307/246 |
| 5,300,874 A | 4/1994 | Shimamoto et al. | | 320/15 |
| 5,302,902 A | 4/1994 | Groehl | | 324/434 |
| 5,313,152 A | 5/1994 | Wozniak et al. | | 320/118 |
| 5,315,287 A | 5/1994 | Sol | | 340/455 |
| 5,321,626 A | 6/1994 | Palladino | | 364/483 |
| 5,321,627 A | 6/1994 | Reher | | 364/483 |
| 5,323,337 A | 6/1994 | Wilson et al. | | 364/574 |
| 5,325,041 A | 6/1994 | Briggs | | 320/44 |
| 5,331,268 A | 7/1994 | Patino et al. | | 320/20 |
| 5,336,993 A | 8/1994 | Thomas et al. | | 324/158.1 |
| 5,338,515 A | 8/1994 | Dalla Betta et al. | | 422/95 |
| 5,339,018 A | 8/1994 | Brokaw | | 320/35 |
| 5,343,380 A | 8/1994 | Champlin | | 363/46 |
| 5,347,163 A | 9/1994 | Yoshimura | | 307/66 |
| 5,352,968 A | 10/1994 | Reni et al. | | 320/35 |
| 5,357,519 A | 10/1994 | Martin et al. | | 371/15.1 |
| 5,365,160 A | 11/1994 | Leppo et al. | | 320/22 |
| 5,365,453 A | 11/1994 | Startup et al. | | 364/481 |
| 5,369,364 A | 11/1994 | Renirie et al. | | 324/430 |

| Patent No. | Date | Inventor | Class |
|---|---|---|---|
| 5,381,096 A | 1/1995 | Hirzel | 324/427 |
| 5,410,754 A | 4/1995 | Klotzbach et al. | 370/85.13 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,453,027 A | 9/1995 | Buell et al. | 439/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,541,489 A | 7/1996 | Dunstan | 320/2 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,578,915 A | 11/1996 | Crouch, Jr. et al. | 320/48 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,614,788 A | 3/1997 | Mullins et al. | 315/82 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,654,623 A | 8/1997 | Shiga et al. | 320/44 |
| 5,656,920 A | 8/1997 | Cherng et al. | 320/31 |
| 5,661,368 A | 8/1997 | Deol et al. | 315/82 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,707,015 A | 1/1998 | Guthrie | 241/20 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,745,044 A | 4/1998 | Hyatt, Jr. et al. | 340/825.31 |
| 5,747,909 A | 5/1998 | Syverson et al. | 310/156 |
| 5,747,967 A | 5/1998 | Muljadi et al. | 320/39 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A * | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/30 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/43.4 |
| 5,811,979 A | 9/1998 | Rhein | 324/718 |
| 5,818,234 A | 10/1998 | McKinnon | 324/433 |
| 5,820,407 A * | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/21 |
| 5,872,453 A | 2/1999 | Shimoyama et al. | 324/431 |
| 5,895,440 A | 4/1999 | Proctor et al. | 702/63 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,100,670 A | 8/2000 | Levesque | 320/150 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |

| | | | |
|---|---|---|---|
| 6,236,332 B1 | 5/2001 | Conkright et al. ...... 340/825.06 |
| 6,238,253 B1 | 5/2001 | Qualls ..................... 439/759 |
| 6,242,887 B1 | 6/2001 | Burke ...................... 320/104 |
| 6,249,124 B1 | 6/2001 | Bertness .................. 324/426 |
| 6,250,973 B1 | 6/2001 | Lowery et al. ............ 439/763 |
| 6,254,438 B1 | 7/2001 | Gaunt ...................... 439/755 |
| 6,259,170 B1 | 7/2001 | Limoge et al. ........... 307/10.8 |
| 6,259,254 B1 | 7/2001 | Klang ..................... 324/427 |
| 6,262,563 B1 | 7/2001 | Champlin ................ 320/134 |
| 6,263,268 B1 | 7/2001 | Nathanson ................. 701/29 |
| 6,271,643 B1 | 8/2001 | Becker et al. .............. 320/112 |
| 6,275,008 B1 | 8/2001 | Arai et al. ................ 320/132 |
| 6,294,896 B1 | 9/2001 | Champlin ................ 320/134 |
| 6,294,897 B1 | 9/2001 | Champlin ................ 320/153 |
| 6,304,087 B1 | 10/2001 | Bertness .................. 324/426 |
| 6,307,349 B1 | 10/2001 | Koenck et al. ........... 320/112 |
| 6,310,481 B2 | 10/2001 | Bertess .................... 324/430 |
| 6,313,607 B1 | 11/2001 | Champlin ................ 320/132 |
| 6,313,608 B1 | 11/2001 | Varghese et al. ............ 32/132 |
| 6,316,914 B1 | 11/2001 | Bertness .................. 320/134 |
| 6,323,650 B1 | 11/2001 | Bertness et al. ........... 324/426 |
| 6,329,793 B1 | 12/2001 | Bertness et al. ........... 320/132 |
| 6,331,762 B1 | 12/2001 | Bertness .................. 320/134 |
| 6,332,113 B1 | 12/2001 | Bertness .................... 702/63 |
| 6,346,795 B2 | 2/2002 | Haraguchi et al. ......... 320/136 |
| 6,347,958 B1 | 2/2002 | Tsai ........................ 439/488 |
| 6,351,102 B1 | 2/2002 | Troy ....................... 320/139 |
| 6,356,042 B1 | 3/2002 | Kahlon et al. .............. 318/138 |
| 6,359,441 B1 | 3/2002 | Bertness .................. 324/426 |
| 6,359,442 B1 | 3/2002 | Henningson et al. ........ 324/426 |
| 6,363,303 B1 | 3/2002 | Bertness .................... 701/29 |
| RE37,677 E | 4/2002 | Irie ......................... 315/83 |
| 6,384,608 B1 | 5/2002 | Namaky .................. 324/430 |
| 6,388,448 B1 | 5/2002 | Cervas ..................... 324/426 |
| 6,392,414 B2 | 5/2002 | Bertness .................. 324/429 |
| 6,396,278 B1 | 5/2002 | Makhija ................... 324/402 |
| 6,411,098 B1 | 6/2002 | Laletin .................... 324/436 |
| 6,417,669 B1 | 7/2002 | Champlin ................ 324/426 |
| 6,424,157 B1 | 7/2002 | Gollomp et al. ........... 324/430 |
| 6,424,158 B2 | 7/2002 | Klang ..................... 324/433 |
| 6,441,585 B1 | 8/2002 | Bertness .................. 320/132 |
| 6,445,158 B1 | 9/2002 | Bertness et al. ........... 320/104 |
| 6,449,726 B1 | 9/2002 | Smith ..................... 713/340 |
| 6,456,045 B1 | 9/2002 | Troy et al. ................ 320/139 |
| 6,466,025 B1 | 10/2002 | Klang ..................... 324/429 |
| 6,466,026 B1 | 10/2002 | Champlin ................ 324/430 |
| 6,469,511 B1* | 10/2002 | Vonderhaar et al. ........ 324/425 |
| 6,495,990 B2 | 12/2002 | Champlin ................ 320/132 |
| 6,500,025 B1* | 12/2002 | Moenkhaus et al. ........ 439/502 |
| 6,526,361 B1 | 2/2003 | Jones et al. ................. 702/63 |
| 6,531,848 B1 | 3/2003 | Chitsazan et al. ........... 320/153 |
| 6,534,993 B2 | 3/2003 | Bertness .................. 324/433 |
| 6,544,078 B2 | 4/2003 | Palmisano et al. ......... 439/762 |
| 6,556,019 B2 | 4/2003 | Bertness .................. 324/426 |
| 6,566,883 B1 | 5/2003 | Vonderhaar et al. ........ 324/426 |
| 6,570,385 B1 | 5/2003 | Roberts et al. ............. 324/378 |
| 6,586,941 B2 | 7/2003 | Bertness et al. ........... 324/426 |
| 6,597,150 B1 | 7/2003 | Bertness et al. ........... 324/426 |
| 6,600,815 B1 | 7/2003 | Walding ................. 379/93.07 |
| 6,618,644 B2 | 9/2003 | Bean ...................... 700/231 |
| 6,623,314 B1 | 9/2003 | Cox et al. ................. 439/759 |
| 6,628,011 B2 | 9/2003 | Droppo et al. .............. 307/43 |
| 6,629,054 B2 | 9/2003 | Makhija et al. ............. 702/113 |
| 6,667,624 B1 | 12/2003 | Raichle et al. ............. 324/522 |
| 6,679,212 B2 | 1/2004 | Kelling ................. 123/179.28 |
| 6,777,945 B2 | 8/2004 | Roberts et al. ............. 324/426 |
| 6,796,841 B1* | 9/2004 | Cheng et al. ............. 439/620.3 |
| 2002/0010558 A1 | 1/2002 | Bertness et al. .............. 702/63 |
| 2002/0030495 A1 | 3/2002 | Kechmire ................. 324/427 |
| 2002/0050163 A1 | 5/2002 | Makhija et al. .............. 73/116 |
| 2002/0171428 A1 | 11/2002 | Bertness .................. 324/426 |
| 2002/0176010 A1 | 11/2002 | Wallach et al. ........... 348/229.1 |
| 2003/0025481 A1 | 2/2003 | Bertness .................. 320/155 |

| | | | |
|---|---|---|---|
| 2003/0036909 A1 | 2/2003 | Kato ........................ 704/275 |
| 2003/0184262 A1 | 10/2003 | Makhija ................... 320/130 |
| 2003/0184306 A1 | 10/2003 | Bertness et al. ............. 324/426 |
| 2004/0000590 A1 | 1/2004 | Raichle et al. ......... 235/462.01 |
| 2004/0000891 A1 | 1/2004 | Raichle et al. ............. 320/107 |
| 2004/0000893 A1 | 1/2004 | Raichle et al. ............. 320/135 |
| 2004/0000913 A1 | 1/2004 | Raichle et al. ............. 324/426 |
| 2004/0000915 A1 | 1/2004 | Raichle et al. ............. 324/522 |
| 2004/0002824 A1 | 1/2004 | Raichle et al. ............... 702/63 |
| 2004/0002825 A1 | 1/2004 | Raichle et al. ............... 702/63 |
| 2004/0002836 A1 | 1/2004 | Raichle et al. ............. 702/188 |
| 2004/0049361 A1 | 3/2004 | Hamdan et al. ............ 702/115 |
| 2004/0051533 A1 | 3/2004 | Namaky .................. 324/426 |
| 2004/0054503 A1 | 3/2004 | Namaky .................. 702/183 |
| 2004/0178185 A1* | 9/2004 | Yoshikawa et al. .......... 219/270 |

FOREIGN PATENT DOCUMENTS

| | | |
|---|---|---|
| EP | 0 637 754 A1 | 2/1995 |
| EP | 0 772 056 A1 | 5/1997 |
| EP | 0 022 450 A1 | 1/1998 |
| FR | 2 749 397 | 12/1997 |
| GB | 2 088 159 A | 6/1982 |
| GB | 2 246 916 A | 10/1990 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98./04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |

OTHER PUBLICATIONS

Operator's Manual for "Modular Computer Analyzer," Sun, Model MCA 3000, Table of Contents and pp. 1-1 to 1-2; 2-1 to 2-19; 3-1 to 3-47; 4-1 to 4-27; 5-1 to 5-18; 6-1 to 6-16; 7-1 to 7-9; 8-1 to 8-5; 9-1 to 9-13; 10-1 to 10-10; 11-1 to 11-22; 12-1 to 12-33; 13-1 to 13-2; 14-1 to 14-13 (1991).

Allen Test, Testproducts Division, "Programmed Training Course for 62-000 Series Smart Engine Analyzer," 2 page cover, Table of Contents, pp. 1-207 (1984).

Mauracher et al., P., "Dynamic modelling of lead/acid batteries using impedance spectroscopy for parameter identification", Journal of Power Sources 67, pp. 69-84, 1997.

Huet, F., "A review of impedance measurements for determination of the state-of-charge or state-of-health of secondary batteries", Journal of Power Soureces 70, pp. 59-69, 1998.

Atwater et al., T., "Improved Impedance Spectroscopy Technique for Status Determination of Production $Li/SO_2$ Batteries", pp. 110-113, 1992.

Search Report from Application No. GB0421447.4.

Examination Report form Application No. GB0417678.0.

Champlin et al., K. S., "Results of Discrete Frequency Immittance Spectroscopy (DFIS) Measurements of Lead Acid Batteries", INTELEC 2001, Oct. 2001.

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128-131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Batttery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design a 60 Hz Notch Filter with the UAF42", Jan. 1994, AB-071, 1994.

National Semiconductor Corporation, "LMF90-$4^{th}$-Order Elliptic Notch Filter", Dec. 1994, RRD-B30M115, Dec. 1994.

"Alligator Clips with Wire Penetrators" *J.S. Pooper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Notification of Transmittal of The International Search Report or the Declaration", PCT/US03/27696.

\* cited by examiner

REPLACEABLE CLAMP FOR ELECTRONIC BATTERY TESTER

BACKGROUND OF THE INVENTION

The present invention relates to electronic battery testers and chargers of the type used to electrically test and charge storage batteries. More specifically, the present invention relates to clamps which are used to electrically couple such electronic battery testers and chargers to terminals of storage batteries.

Storage batteries are used in many applications as sources of power. For example, storage batteries are used in automotive vehicles, both electrical vehicles and vehicles with internal combustion engines, as well as power supplies such as backup power systems. It is often desirable to measure the condition of such storage batteries. For example, it can be useful to determine the amount of charge a storage battery can hold (i.e. the capacity of the battery) or the state of health of a storage battery.

A number of battery testing techniques are known in the art. These techniques include measuring the specific gravity of acid contained in a storage battery. Measuring a battery voltage and performing a load test on a battery in which a large load is placed on the battery and the response observed. More recently, a technique has been pioneered by Dr. Keith S. Champlin and Midtronics, Inc. of Willowbrook, Ill. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BAT- TERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Pat. No. 6,469,511, issued Nov. 22, 2002, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER; U.S. Ser. No. 10/042,451, filed Jan. 8, 2002, entitled BATTERY CHARGE CONTROL DEVICE; U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,255, filed Dec. 31, 2002, entitled REMAINING TIME PREDICTIONS; U.S. Ser. No. 60/437,224, filed Dec. 31, 2002, entitled DISCHARGE VOLTAGE PREDICTIONS; U.S. Ser. No. 60/437,611, filed Jan. 2, 2003, entitled REMAINING TIME PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 09/654,217, filed Sep. 1, 2000, entitled SYSTEM AND METHOD FOR PROVIDING STEP-DOWN POWER CONVERSION USING INTELLIGENT SWITCH; U.S. Pat. No. 6,465,908, issued Oct. 15, 2002, entitled INTELLIGENT POWER MANAGEMENT SYSTEM; U.S. Pat. No. 6,497,209, issued Dec. 24, 2002, entitled SYSTEM AND METHOD FOR PROTECTING A CRANKING SUBSYSTEM; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,377,031, issued Apr. 23, 2002, entitled INTELLIGENT SWITCH FOR POWER MANAGEMENT; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Pat. No. 6,507,196, issued Jan. 14, 2003; entitled BATTERY HAVING DISCHARGE STATE INDICATION; U.S. Pat. No. 5,871,858, issued Feb. 16, 1999, entitled ANTI-THEFT BATTERY; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/280,186, filed Oct. 25, 2002, entitled BATTERY TESTER CONFIGURED TO RECEIVE A REMOVABLE DIGITAL MODULE; and U.S. Ser. No. 10/681,666, filed Oct. 8, 2003, entitled ELECTRONIC BATTERY TESTER WITH PROBE LIGHT; which are incorporated herein in their entirety.

Electronic battery testers and chargers are often used in harsh environments and are expected to function properly over an extended period of time. One source of failure in electronic battery testers and chargers are the clamps which are used to electrically couple the battery tester to terminals of storage batteries.

SUMMARY OF THE INVENTION

A method and apparatus for coupling a battery charger and/or a battery tester to a battery is provided. In one aspect of the present invention, a clamp can be selectively removed from a cable. This allows replacement of the clamp as desired. The cable can be fixedly or removably coupled to the battery tester or charger.

BRIEF DESCRIPTION OF THE DRAWINGS

FIG. 2-1 is a perspective view of a replaceable clamp electrically coupled with a cable in accordance with an embodiment of the present invention.

FIG. 2-2 is a perspective view of a replaceable clamp partially cutaway and electrically coupled with a cable in accordance with an embodiment of the present invention.

FIG. 2-3 is a perspective view of a replaceable clamp disconnected from a cable in accordance with an embodiment of the present invention.

FIG. 3 is a simplified block diagram of a battery tester with which the present invention is useful.

DETAILED DESCRIPTION OF THE PREFERRED EMBODIMENTS

In the discussion below, the term "battery contact" is used to define a portion of the battery onto which the replaceable clamp of the present invention can be applied. The actual contact is an electrical contact and can be placed some distance from the battery.

Figure 1:
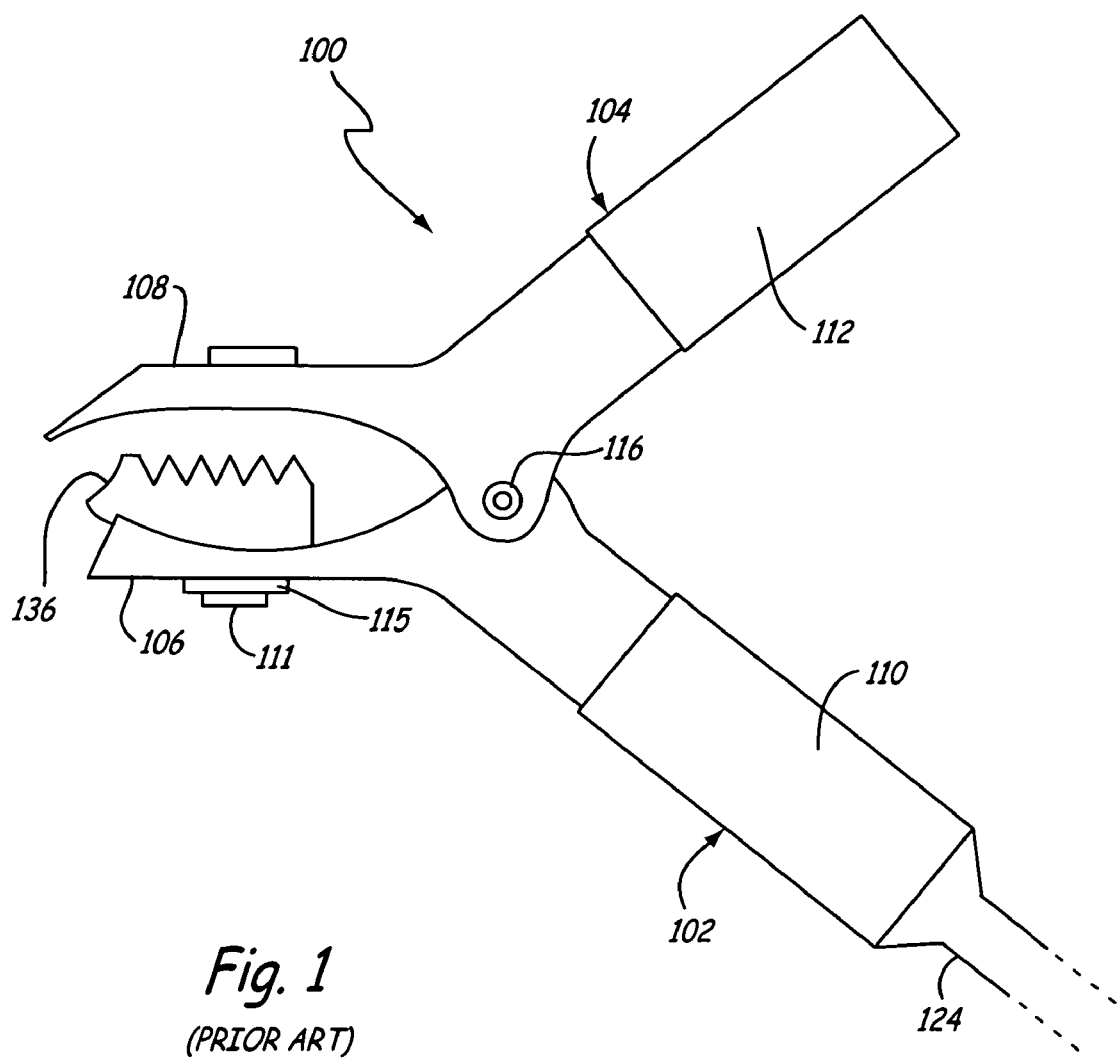
FIG. 1 is a side view of a clamp in accordance with the prior art.

FIG. 1 is a side view of a Kelvin clamp 100 in accordance with the prior art. Clamp 100 includes first elongate clamp member 102 having a first jaw 106 and first hand grip 110 separated by a first coupling (hidden from view). Clamp 100 also includes second elongate clamp member 104 having a second jaw 108 and a second hand grip 112 separated by second coupling 116. Second elongate clamp member 104 is pivotally joined with first elongate clamp member 102 by second coupling 116 and the first coupling.

First elongate clamp member 102 is coupled to cable 124. Cable 124 includes a first electrical conductor (hidden from view) and a second electrical conductor (hidden from view), which are electrically isolated from each other. The first electrical conductor is electrically coupled to first jaw 106 and conductive piece 136, which grips a battery contact. Rivet 111 couples conductive piece 136 to jaw 106 and is insulated from first elongate clamp member 102 by an insulator 115. The second electrical conductor can be electrically coupled to second jaw 108 or electrically coupled to first jaw 108. The first electrical conductor and the second electrical conductor provide Kelvin connections to the battery contacts.

Clamp 100 is used in harsh environments to test and charge lead acid or other batteries. Gases will attack metal and corrode terminals on the clamp causing clamp 100 to easily wear out. The present invention provides a replaceable clamp for quickly and efficiently replacing a corroded clamp with a non-corroded clamp in the field by a user.

Figures 1, 2:
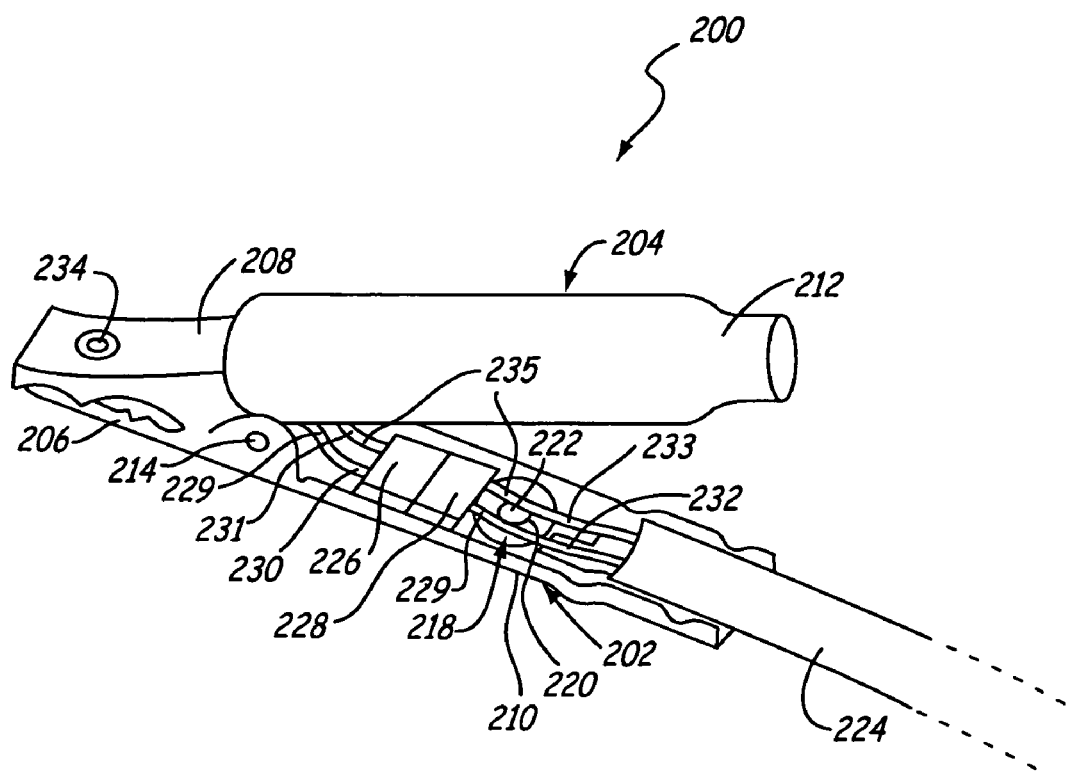
Figure 2:
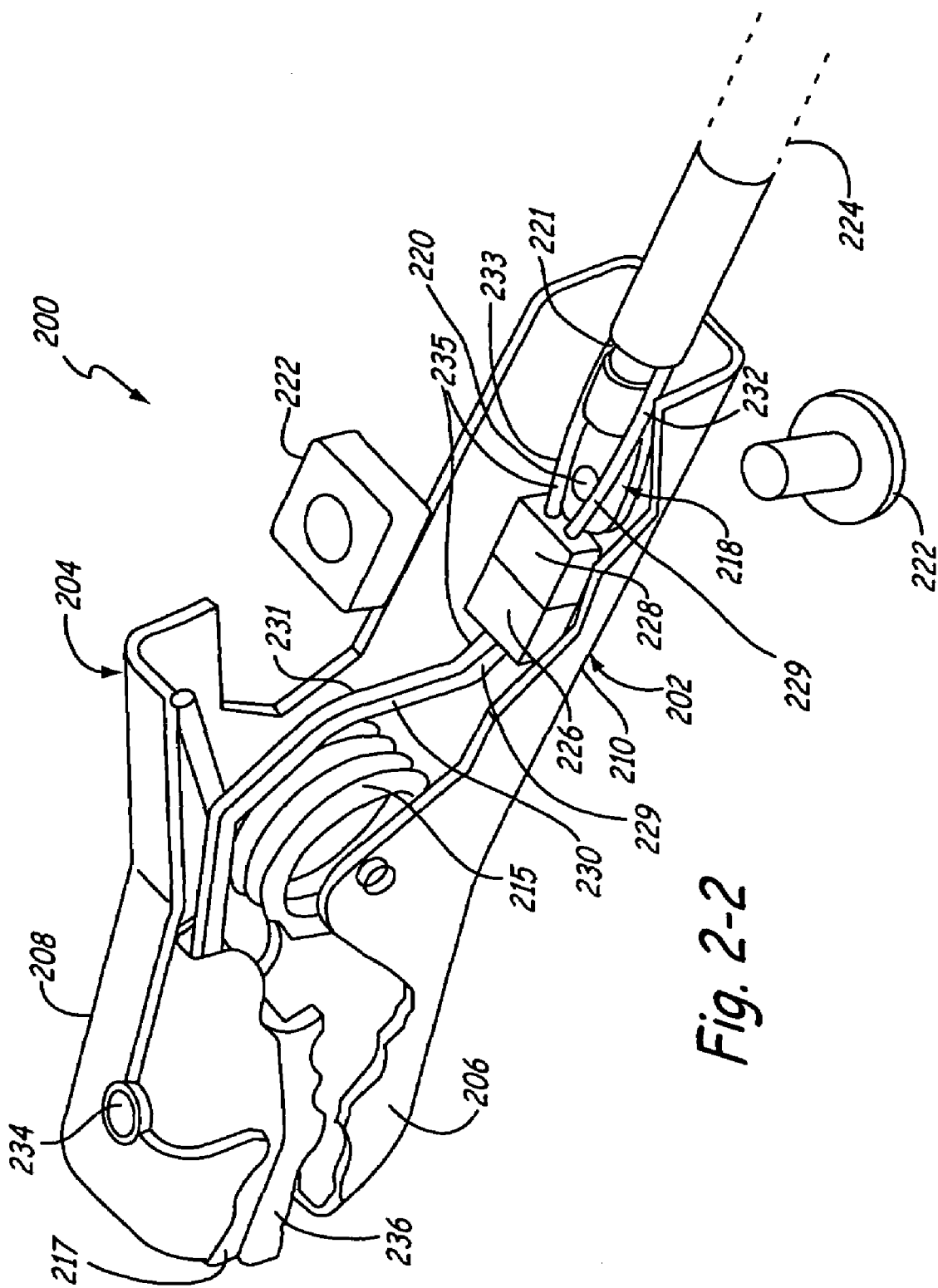
Figures 2, 3:
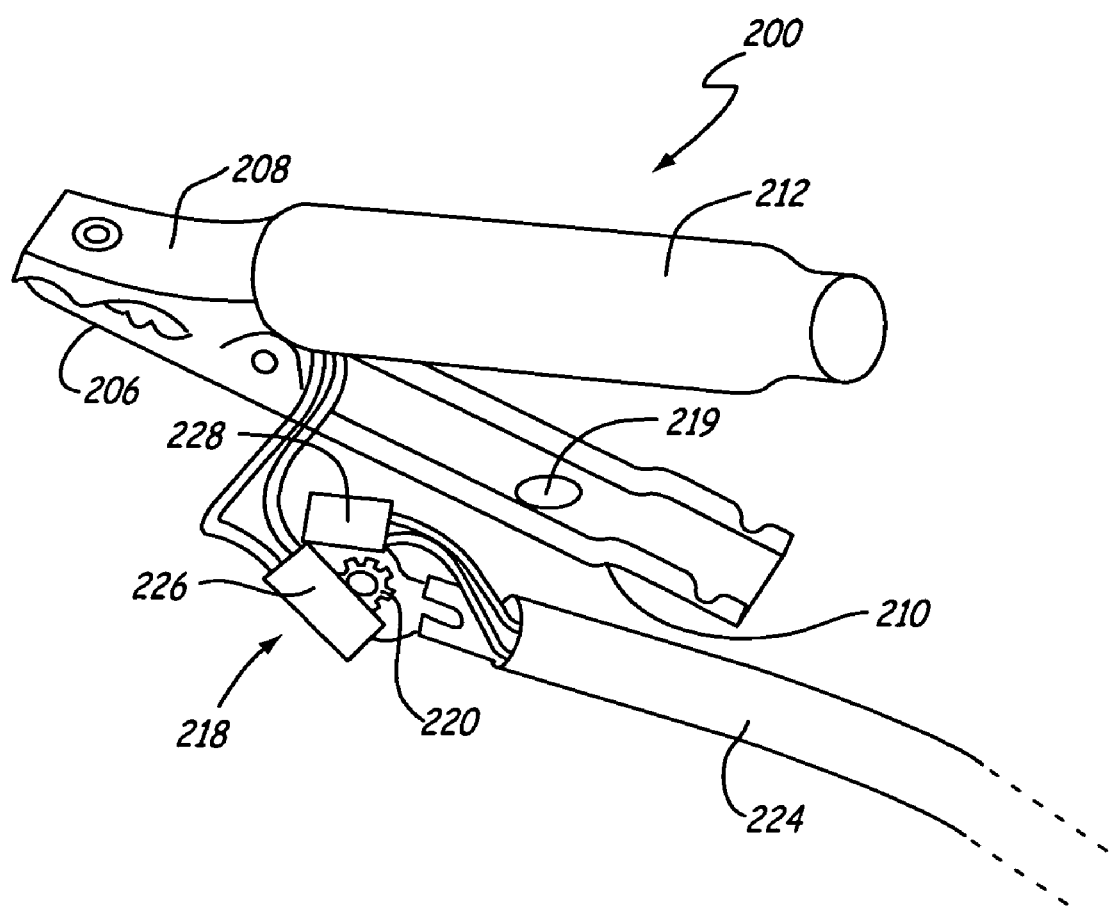
Figure 3:
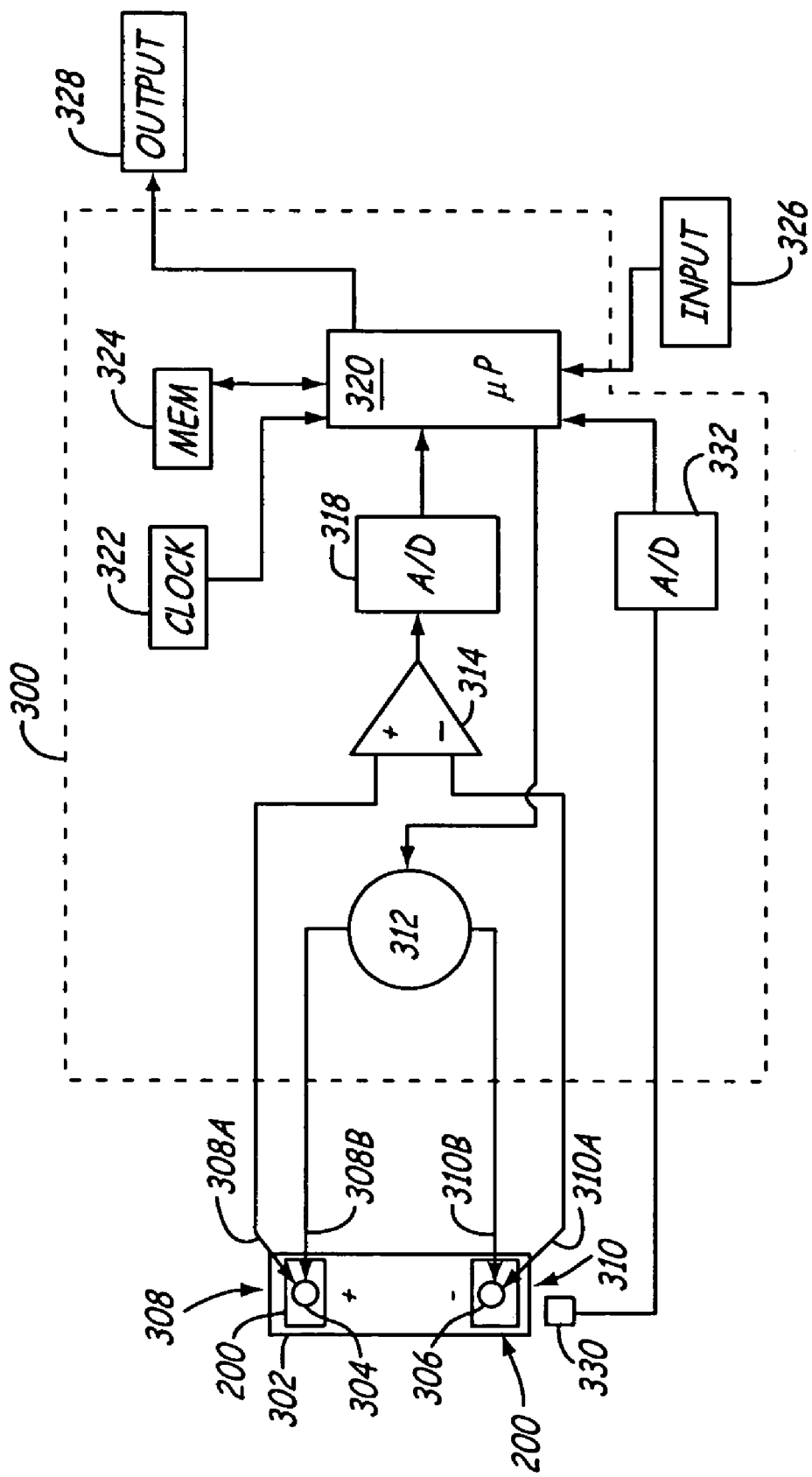

FIGS. 2-1 through 2-3 are perspective views of replaceable clamp 200 in accordance with an embodiment of the present invention. Clamp 200 is designed to electrically connect cable 224 from a battery tester and/or charger (not shown) to a battery contact. Clamp 200 can either connect to a negative or positive battery contact. FIGS. 2-1 through 2-3 illustrate this electrical connection as a Kelvin connection, a sensor lead connection, and a connection capable of carrying a high current for charging a battery. Other types of connections that electrically connect the battery tester or charger to the battery contacts are within the scope of the present invention.

FIG. 2-1 illustrates clamp 200 electrically connected with cable 224 and configured in a closed position. Clamp 200 includes a first elongate clamp member 202 which has first jaw end 206 and first hand grip end 210 separated by first pivot coupling 214. Replaceable clamp 200 also includes second elongate clamp member 204 which has second jaw end 208 and second hand grip end 212 separated by a second pivot coupling (hidden from view). Second elongate clamp member 204 is pivotally joined to first elongate clamp member 202 by first pivot coupling 214 and the second pivot coupling. Pivotally joining first elongate clamp member 202 to second elongate clamp member 204 causes first jaw end 206 to be aligned with second jaw end 208. First jaw end 206 and second jaw end 208 are in a closed position.

FIG. 2-2 illustrates clamp 200 partially cutaway and electrically connected with cable 224. Clamp 200 includes a spring 215 coupled to first elongate clamp member 202 and second elongate clamp member 204. The spring is configured to urge first jaw end 206 and second jaw end 208 together in a closed position. First elongate clamp member 202 also includes electrically conductive piece 236, which is mechanically coupled to second jaw end 208 by rivet 234. An insulator 217 isolates rivet 234 from conductive piece 236.

Referring to both FIGS. 2-1 and 2-2, cable 224 includes a main electrical conductor 221, a first electrical conductor 229 and a second electrical conductor 235. Those skilled in the art will recognized that multiple electrical conductor can be housed in cable 224 to electrically connect to a clamp, such as clamp 200.

The main electrical conductor 221 is capable of carrying a high current such that the high current can charge a battery. Terminal 218 is electrically coupled to the main electrical conductor. Terminal 218 includes terminal hole 220 which aligns with first hole (not shown in FIG. 2-1 or 2-2) of first hand grip 210. Removable fastener 222 (shown fastened in FIGS. 2-1 and shown unfastened in FIGS. 2-2) couples terminal 218 to first hand grip 210 through the first hole and terminal hole 220 such that fastener 222 can disconnect clamp 200 from cable 224. Clamp 200 includes a first wire connector 230 that is electrically coupled to conductive piece 236 at one end and coupled to a first electrical plug 226 at the other end. Clamp 200 also includes a second wire connector 231 that is electrically coupled to second jaw 208 through rivet 234 at one end and coupled to first electrical plug 226 at the other end. First and second electrical conductors 229 and 235 of cable 224 are electrically coupled to a second electrical plug 228. First electrical plug 226 is removably electrically connected with second electrical plug 228.

In one embodiment of the present invention, first electrical conductor 229 and second electrical conductor 235 together provide a Kelvin connection capable of injecting a forcing function into a battery as well as measuring a voltage across the battery. In another embodiment of the present invention, first electrical conductor 229 includes two electrically isolated contacts which provide a Kelvin connection and second electrical conductor 235 provides a sensor lead that is capable of sensing a physical property of the battery, such as temperature as discussed in FIG. 3. Those skilled in the art will recognize that electrical conductors 229 and 235 can be electrically coupled anywhere along first and second elongate clamp members 202 and 204 as long as at least one of first and second electrical conductors 229 and 235 electrically couple with a battery contact to provide a Kelvin connection or a sensor lead.

FIGS. 2-3 illustrates replaceable clamp 200 with removable fastener (not shown in FIG. 2-3) removed from terminal 218 and first electrical plug 226 electrically disconnected from second electrical plug 228. FIGS. 2-3 also illustrates first hole 219 formed in first hand grip 210 such that terminal hole 220 will align with first hole 219 when the fastener is connecting cable 224 to clamp 200. Electrical plugs 226 and 228 and the removable fastener electrically disconnect clamp 200 from cable 224. Thus, clamp 200 can be entirely replaced with a second clamp having a similar configuration. In general, first jaw 206, second jaw 208 and the electrically conductive piece (not shown in FIGS. 2-3) can be formed of an electrically conductive material such as copper. In addition, insulating grips can be provided on first and second hand grips (210, 212) for user protection.

FIG. 3 is a simplified block diagram of an example electronic battery tester circuitry 300 with which the present invention is useful. The present invention is not restricted in application to the battery test circuitry 300 of FIG. 3. Other types of battery test circuitry are within the scope of the present invention. Illustrated in FIG. 3 is a four point (or Kelvin connection) technique used to couple system 300 to battery 302. Connections 308 and 310 are used to couple to battery contacts 304 and 306, respectively, of battery 302. Connection 308 includes two individual connections 308A and 308B. Similarly, connection 310 includes two individual connections 310A and 310B. Clamps 200 of the present invention grasp battery contacts 304 and 306 and couple them to electrical connections 308 and 310.

Circuitry 300 includes a current source 312 and a differential amplifier 314. Current source 312 is coupled to connections 308B and 310B of connections 308 and 310, respectively. Differential amplifier 314 is coupled to connection 308A and connections 310A of connections 308 and 310, respectively. An output from differential amplifier 314 is provided to analog to digital converter 318 which itself provides a digitized output to microprocessor 320. Microprocessor 320 is connected to a system clock 322, a memory 324 and analog to digital converter 318. Microprocessor 320 is also capable of receiving an input from an input device 326 and providing an output of output device 328. The input can be, for example, a rating for the battery 302. Input device can comprise any of the following multiple types of input devices. The result of a battery test, either qualitative or quantitative, can be an output device 328. Device 328 can be a display or other output. The invention can operate with any technique for determining a voltage across battery 302 and a current through battery 302 and is not limited to the specific techniques set forth herein. The forcing function source or current source 312 can provide any signal having a time varying component, including a stepped pulse or a periodic signal, having any shape, applied to battery 302. The current source can be an active source in which the current source signal is injected into battery 302, or can be a passive source, such as a load, which is switched on under the control of microprocessor 320.

In operation, microprocessor 320 determines a dynamic parameter, such as dynamic conductance, of battery 302 as a function of sensed voltage and current. The change in these sensed values is used to determine the dynamic parameter. A temperature sensor 330 can be thermally coupled to battery 302 and used to compensate battery measurements. Temperature readings can be stored in memory 324 for later retrieval.

Figure 4:
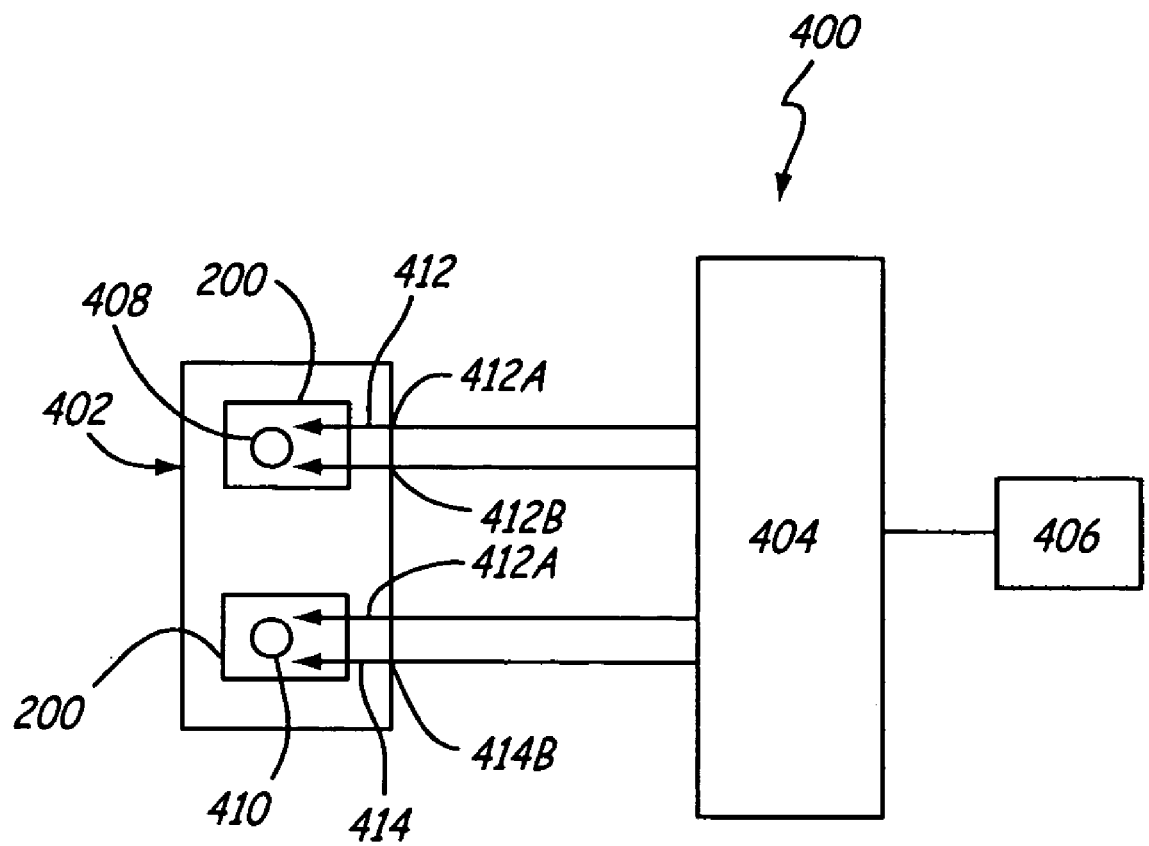
FIG. 4 is a simplified block diagram of a battery charger with which the present invention is useful.

FIG. 4 is a simplified block diagram of a battery charging system 400 with which the present invention is useful. The present invention is not restricted in application to the battery charging system 400 of FIG. 4. Other types of battery charging systems are within the scope of the present invention. System 400 is shown coupled to battery 402. System 400 includes battery charging and testing circuitry 404 and microprocessor 406. System 400 couples to battery contacts 408 and 410 through Kelvin electrical connections 412 and 414 respectively. Electrical connection 412 includes a first connection 412A and second connection 412B and connection 414 includes a first connection 414A and a second connection 414B. Clamps 200 of the present invention provide coupling between battery contacts 408 and 410 and electrical connections 412 and 414. Battery charger 400 operates in a manner similar to the battery charger set forth in U.S. Pat. No. 6,104,167, issued Aug. 15, 2000, and entitled "METHOD AND APPARATUS FOR CHARGING A BATTERY", which is incorporated herein by reference.

Although the present invention has been described with reference to preferred embodiments, workers skilled in the art will recognize that changes may be made in form and detail without departing from the spirit and scope of the invention.

What is claimed is:

1. An apparatus for coupling at least a battery tester to a battery comprising:
    a replaceable clamp comprising:
        a first hand grip having a first hole;
        a first electrical plug positioned in the first hand grip and electrically coupled to a first set of Kelvin conductors, the first set of Kelvin conductors including a first wire and a second wire;
    a cable including a second set of Kelvin conductors, the second set of Kelvin conductors including a first wire and a second wire;
    a second electrical plug electrically coupled to the first and second wires of the second set of Kelvin conductors, wherein the first electrical plug and the second electrical plug are removably electrically couple together in the first hand grip such that the first set of Kelvin conductors and the second set of Kelvin conductors are removably electrically coupled together;
    a terminal coupled to the cable having a terminal hole aligned with the first hole in the first hand grip; and
    a removable fastener which couples the terminal to the first hand grip through the terminal hole in the first hand grip.

2. The apparatus of claim 1, wherein the terminal comprises a tin-plated ring.

3. The apparatus of claim 1, wherein the removable fastener comprises a nut and bolt.

4. The apparatus of claim 1, wherein when the first electrical plug and the second electrical plug are electrically coupled together, the first set of Kelvin conductors and the second set of Kelvin conductors are capable of injecting a forcing function into a battery and providing a sensor lead for sensing a physical property of the battery.

5. The apparatus of claim 1, wherein the first and second set of Kelvin conductors comprise acid-resistant conductors.

6. An apparatus for coupling at least a battery tester to a battery comprising:
    a replaceable clamp configured to contact a battery, the replaceable clamp comprising:
        a first hand grip having an aperture;
        a first electrical plug positioned in the first hand grip and electrically coupled to a first set of Kelvin conductor, the first set of Kelvin conductors including a first wire and a second wire;
    a cable including a second set of Kelvin conductors and a terminal, the second set of Kelvin conductors including a first wire and a second wire and the terminal including a terminal hole aligned with the aperture in the first hand grip;
    a second electrical plug electrically coupled to the first and second wires of the second set of Kelvin conductors, wherein the first electrical plug and the second electrical plug are removably electrically couple together in the first hand grip such that the first set of Kelvin conductors and the second set of Kelvin conductors are removably electrically coupled together; and
    a removable fastener for removably coupling the terminal to the replaceable clamp through the terminal hole and the aperture in the first hang grip.

7. The apparatus of claim 6, wherein the terminal comprises a tin-plated ring.

8. The apparatus of claim 6, wherein the removable fastener comprises a nut and bolt.

9. The apparatus of claim 6, wherein when the first electrical plug and the second electrical plug are electrically coupled together, the first set of Kelvin conductors and the second set of Kelvin conductors are capable of injecting a forcing function into a battery and providing a sensor lead for sensing a physical property of the battery.

10. The apparatus of claim 6, wherein the first and second set of Kelvin conductors comprise acid-resistant conductors.

11. A method
    obtaining a first replaceable clamp including a first hand grip having a first hole, a first electrical plug positioned in the first hand grip and a first set of Kelvin conductors having a first wire and a second wire, the first electrical plug electrically coupled to the first and second wires of the first set of Kelvin conductors;
    obtaining a cable including a terminal having a terminal hole and second set of Kelvin conductor having a first wire and a second wire electrically coupled to a second electrical plug; removably electrically coupling the first electrical plug to the second electrical plug in the first hand grip; and removably fastening the terminal to the first hand grip through the terminal hole and the first hole in the first hand grip; and
    connecting the terminal to the fist hand grip of the second replaceable clamp.

* * * * *

UNITED STATES PATENT AND TRADEMARK OFFICE
CERTIFICATE OF CORRECTION

PATENT NO. : 7,598,699 B2
APPLICATION NO. : 10/783682
DATED : October 6, 2009
INVENTOR(S) : Harvey A. Restaino et al.

It is certified that error appears in the above-identified patent and that said Letters Patent is hereby corrected as shown below:

Column 9,
Line 46, delete "couple" and insert --coupled--.

Column 10,
Line 14, delete "conductor" and insert --conductors--.
Line 29, delete "hang" and insert --hand--.
Line 50, delete "conductor" and insert --conductors--.
Delete lines 57-58.

Signed and Sealed this

Second Day of March, 2010

David J. Kappos
*Director of the United States Patent and Trademark Office*